(12) United States Patent
Tanaka et al.

(10) Patent No.: US 7,846,829 B2
(45) Date of Patent: Dec. 7, 2010

(54) STACKED SOLDER BALLS FOR INTEGRATED CIRCUIT DEVICE PACKAGING AND ASSEMBLY

(75) Inventors: Junji Tanaka, Kanagawa (JP);
Masahiko Harayama, Kanagawa (JP);
Masanori Onodera, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 95 days.

(21) Appl. No.: 12/196,210

(22) Filed: Aug. 21, 2008

(65) Prior Publication Data

US 2009/0212423 A1   Aug. 27, 2009

(30) Foreign Application Priority Data

Aug. 21, 2007   (JP) .............................. 2007-215189

(51) Int. Cl.
| | |
|---|---|
| H01L 21/44 | (2006.01) |
| H01L 23/52 | (2006.01) |
| H01L 23/48 | (2006.01) |
| H01L 29/40 | (2006.01) |
| H01L 23/485 | (2006.01) |
| H01L 23/498 | (2006.01) |

(52) U.S. Cl. ........................ 438/613; 438/612; 257/780; 257/779; 257/738; 257/E23.023; 257/E23.021; 257/E23.069

(58) Field of Classification Search ................ 438/612, 438/613; 257/738, 779, 780, E23.023, E23.021, 257/E23.069
See application file for complete search history.

(56) References Cited

U.S. PATENT DOCUMENTS

| | | | | |
|---|---|---|---|---|
| 6,541,848 | B2 * | 4/2003 | Kawahara et al. | 257/690 |
| 6,940,178 | B2 * | 9/2005 | Kweon et al. | 257/780 |
| 7,049,217 | B2 * | 5/2006 | Ishikawa et al. | 438/613 |
| 7,183,648 | B2 * | 2/2007 | Ramanathan et al. | 257/738 |
| 7,223,695 | B2 * | 5/2007 | Zhong et al. | 438/687 |
| 2003/0096494 | A1 * | 5/2003 | Sakuyama et al. | 438/613 |

* cited by examiner

*Primary Examiner*—Luan C Thai (57) ABSTRACT

A semiconductor device is provided that includes a semiconductor chip, a plurality of solder bumps that electrically couple the semiconductor chip to the outside, and a metal bump being provided on the surface of each first solder bump which is at least a part of the plurality of solder bumps and being made of a metal having a melting point higher than that of the first solder bump. The wettability of the first solder bump is improved as each metal bump serves as a core when the corresponding first solder bump melts. Thus, the connection reliability of the first solder bump can be improved.

10 Claims, 9 Drawing Sheets

FIG. 1

(Prior Art)

//  STACKED SOLDER BALLS FOR INTEGRATED CIRCUIT DEVICE PACKAGING AND ASSEMBLY

PRIORITY CLAIM

This application claims priority from Japanese patent application 2007-215189 filed on Aug. 21, 2007.

FIELD OF THE INVENTION

The present invention relates to a semiconductor device having solder bumps for electrically coupling a semiconductor chip to external circuits.

BACKGROUND OF THE INVENTION

The use of solder bumps to implement electrical connections for an integrated circuit die is used throughout electronics industry. A large variety of different types of semiconductor devices implement electronic connections between an internal die and a number of different types of external circuits. The solder bumps function by electrically coupling the semiconductor chip to an external electronic circuit. Since semiconductor devices are mechanically and electrically coupled to external electrical circuits via the solder bumps, a high reliability connection is required. Japanese Patent Application Publications No. JP-A-2000-150574, JP-A-2000-183088, JP-A-H10-50708, and JP-A-H3-50736 disclose semiconductor devices with improved connection reliability of solder bumps.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Embodiments of the claimed subject matter produce a semiconductor device with improved connection reliability of solder bumps and a method for manufacturing the same. In one embodiment, a semiconductor device includes: a semiconductor chip; a plurality of solder bumps that electrically couple the semiconductor chip to the outside; and a metal bump being provided on a surface of each first solder bump which is at least a part of the plurality of solder bumps and being made of a metal having a melting point higher than that of the first solder bump.

In one embodiment, a method for manufacturing a semiconductor device according to another aspect of the present invention includes the steps of: forming a metal bump on a surface of each first solder bump which is at least a part of a plurality of solder bumps that electrically couple a semiconductor chip to an external electrode, the metal bump being made of a metal having a melting point higher than that of the first solder bump; and bonding the first solder bump on a mounting portion where the semiconductor chip is mounted. This method makes it possible to increase the wettability of the solder bumps, because each metal bump serves as a core when the corresponding solder bump melts. As a result, it is possible to bond the solder bumps to the mounting portion in a stable manner.

In another embodiment, a method for manufacturing a semiconductor device according to a still another aspect of the present invention includes the steps of: applying, to a surface of a solder bump that electrically couples a semiconductor chip to an external electrode, a flux containing a metal with a higher melting point than that of the solder bump; and bonding the solder bump having the surface to which the flux is applied on a mounting portion where the semiconductor chip is mounted. This method makes it possible to enhance the wettability of the solder bump because the flux contains a metal having a melting point higher than that of the solder bump, thereby bonding the solder bump to the mounting portion in a stable manner, and allows the SoC integrated circuit device to optimize power consumption in accordance with the particular application being supported, thereby maximizing battery life and overall device usability.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Figure 1:
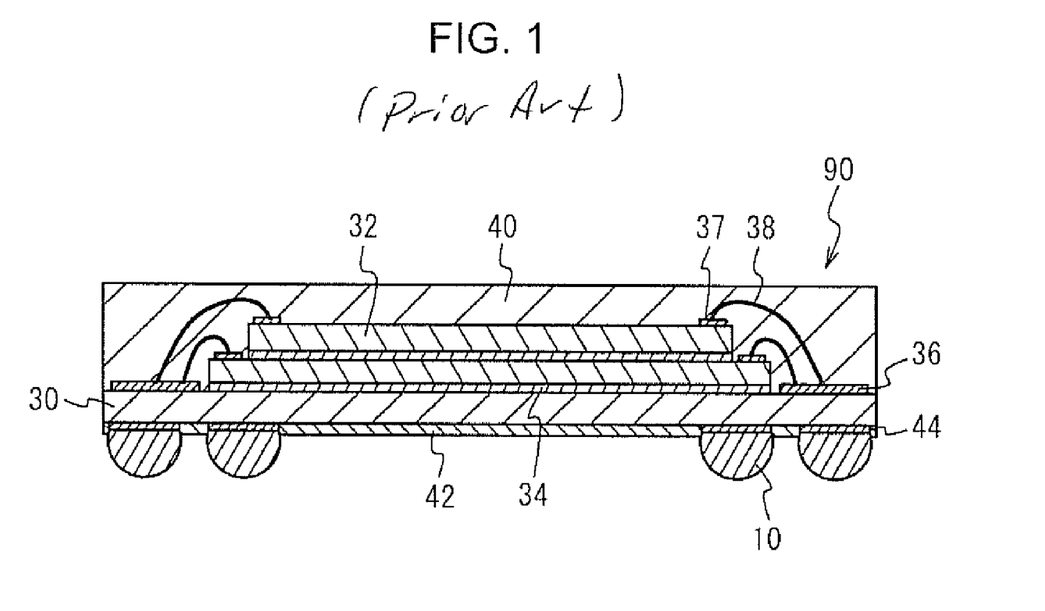
FIG. 1 shows a cross sectional view showing a configuration of a semiconductor device of related art.

First, the problems to be solved by the present invention will be clarified. FIG. 1 is a cross sectional view showing a configuration of a semiconductor device 90 of related art. Two pieces of semiconductor chips 32 are stacked on an interposer 30 via an adhesive 34. On top surfaces of each semiconductor chip 32, chip electrodes 37 coupled to integrated circuits in the semiconductor chips 32 are provided and are electrically coupled by wires 38 to substrate electrodes 36 provided on the interposer 30. On a top surface of the interposer 30, a molding resin 40 which seals the semiconductor chips 32 is provided. On a bottom surface of the interposer 30, external electrodes 44 which are coupled to the substrate electrodes 36 by an interconnection (not shown) are provided. On a surface of each external electrode 44, a solder bump 10 is provided. In an area on the bottom surface of the interposer 30 where no solder bump 10 is provided, a solder resist 42 is provided. The semiconductor device 90 is mounted, for example, on an interconnection substrate or the like of an electronic device, by soldering the solder bumps 10. In this case, the semiconductor chip 32 is electrically coupled to the outside via the solder bumps 10.

Figure 2:
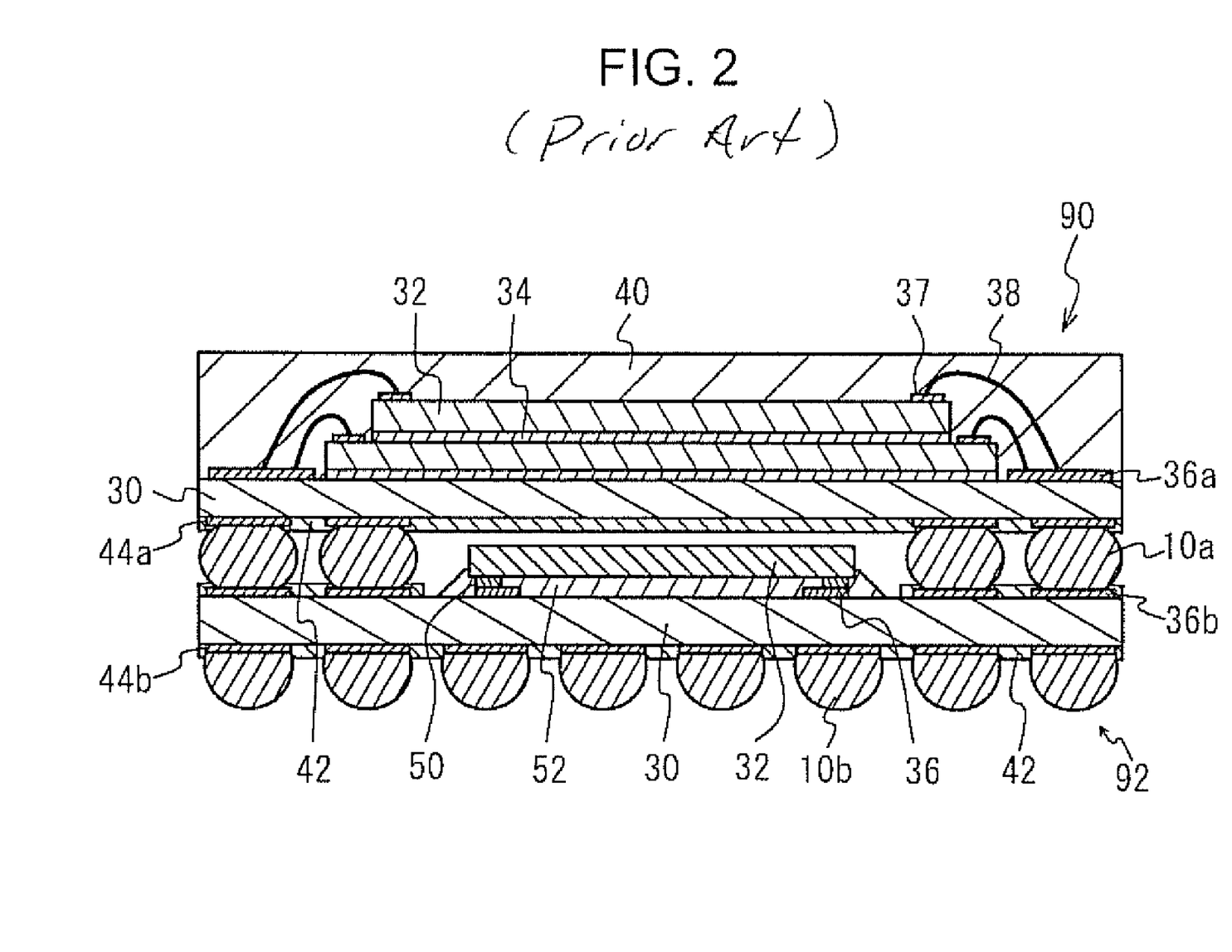
FIG. 2 shows a cross sectional view (part 2) showing the configuration of the semiconductor device of related art.

FIG. 2 is a cross sectional view showing a configuration of a so-called package-on-package semiconductor device in which the semiconductor device 90 shown in FIG. 1 is mounted on another semiconductor device. The components common to those shown in FIG. 1 are given the same numerals and their detailed descriptions are omitted. In a semiconductor device 92 at the bottom, the semiconductor chip 32 is mounted on the top surface of the interposer 30 by flip-chip bonding. The semiconductor chip 32 and each substrate electrode 36 on the interposer 30 are coupled via a bump electrode 50, and an underfill material 52 is filled between the semiconductor chip 32 and the interposer 30. A solder bump 10a provided on the bottom surface of the semiconductor device 90 is soldered to each substrate electrode 36b of the semiconductor device 92. The semiconductor devices 90 and 92 are mechanically secured by the solder bumps 10a and are electrically coupled via the solder bump 10a. In such a package-on-package semiconductor device, as the packaging density can be increased by stacking a plurality of semiconductor chips, miniaturization and cost reduction of the semiconductor device can be achieved.

For example, as shown in FIG. 2, when mounting one semiconductor device onto another semiconductor device stacked, the semiconductor device at the bottom may get deformed by the heat generated while soldering and the planarity of the mounting portion where the solder bumps are to be soldered may be impaired. As just described, some irregularities on the mounting portion of the solder bumps or low wettability (conformability) of solder to the mounting portion may result in poor bonding of the solder bumps.

In order to solve the problems described above, it is an object of the present invention to provide a semiconductor device with improved connection reliability of the solder bumps and a method for manufacturing the same.

With reference to the accompanying drawings, embodiments of the present invention will be described below.

First Embodiment

Figure 3:
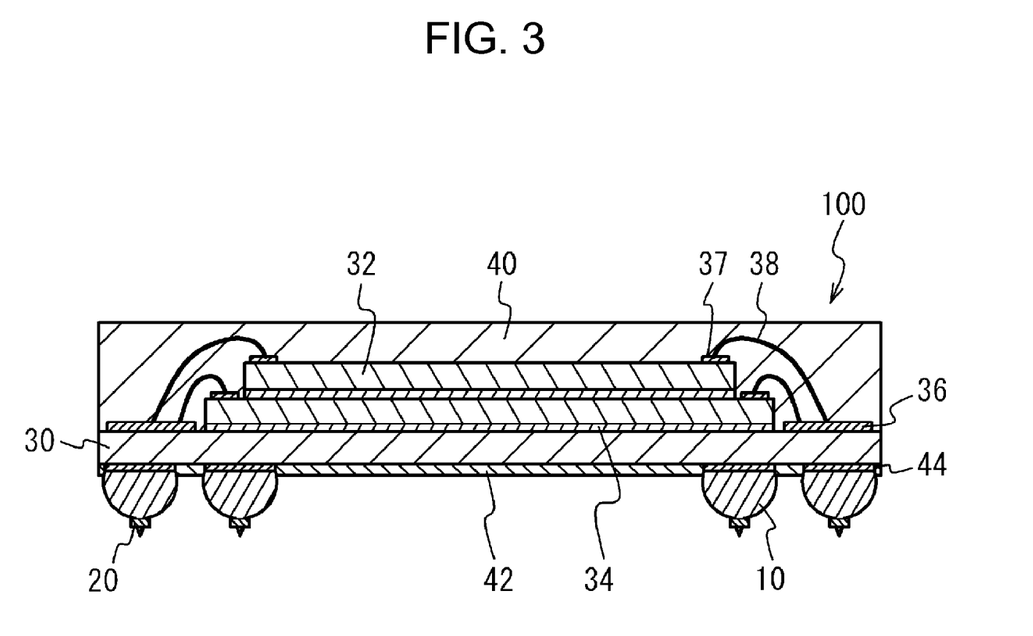
FIG. 3 shows is a cross sectional view showing a configuration of a semiconductor device of a first embodiment of the present invention.

FIG. 3 is a cross sectional view showing a configuration of a semiconductor device 100 of a first embodiment of the present invention. On the top surface of the interposer 30 made of epoxy-based resin, two pieces of semiconductor chips 32 made of silicon are stacked via an adhesive 34 made of acrylic resin. On top surfaces of the semiconductor chips 32, the chip electrodes 37 of copper coupled to integrated circuits in the semiconductor chips 32 are provided and electrically coupled by the wires 38 of gold to the substrate electrodes 36 of copper provided on the interposer 30. On the top surface of the interposer 30, the molding resin 40 of epoxy-based which seals the semiconductor chips 32 and the wires 38 is provided. On the bottom surface of the interposer 30, the external electrodes 44 of copper which are coupled to the substrate electrodes 36 with an interconnection not shown are provided. On the surface of each external electrode 44, a first solder bump 10 is provided. On a surface of each first solder bump 10, a metal bump 20 is provided. In an area on the bottom surface of the interposer 30 where no first solder bump 10 is provided, a solder resist 42 made of an insulating resin is provided.

The first solder bumps 10 are to secure the semiconductor device 100, for example, on a mounting portion (not shown) of an interconnection substrate or the like of an electronic device, by soldering and to electrically couple the semiconductor chips 32 to the outside. For the first solder bumps 10, an alloy of SnAg-base or SnAgCu-base, for example, can be used. The first solder bumps 10 can be formed, for example, by printing a solder paste using the solder resist 42 as a mask and reflowing it in a batch. The diameter of the solder bumps can be set, for example, between 200 μm and 300 μm.

The metal bumps 20 are made of a conductive metal having a higher melting point than that of the first solder bumps 10 and are provided on the surfaces of the first solder bumps 10. For the metal bumps 20, while any metal member may be used as long as it has a higher melting point than that of the first solder bumps 10 as described above and is capable of etching the first solder bumps 10 when the first solder bumps 10 melt, the metal having high wettability with solder is preferable. As a metal that meets the above requirements, for example, gold is preferable. Furthermore, as the metal bumps 20 etch the first solder bumps 10, it is preferable to have a smaller volume than that of the first solder bumps 10.

The metal bumps 20 can be formed, for example, using a wire bonding tool and a thin metallic wire used for wire bonding, on the surfaces of the solder bumps 10 as stud bumps. For example, using a thin metallic wire having a diameter of 25 μm, when the stud bumps are formed on the surfaces of the first solder bumps 10 by a thermo-compression bonding method, the metal bumps 20 of an approximate height of 50 μm are formed. As described above, while it is preferable to use a thin metallic wire of gold, other than that, a thin metallic wire of copper or aluminum may be used instead.

According to the semiconductor device 100 of the first embodiment, on the surfaces of the first solder bumps 10 which electrically couple the semiconductor chip 32 to the outside, the metal bumps 20 made of a metal having a higher melting point than that of the first solder bumps 10 are provided. Therefore, when mounting the semiconductor device 100 to the mounting portion, each metal bump 20 etches the corresponding first solder bump 10 along with the melting of the first solder bumps 10, and serves as a core. Thus, the wettability of the first solder bumps 10 is improved. As a result, even when there are some minor irregularities on the mounting portion or when the wettability of the first solder bumps 10 to the mounting portion is not so high, as the first solder bumps 10 can be stably soldered to the mounting portion, the connection reliability of the first solder bumps 10 is improved.

As shown in FIG. 3, each of the metal bumps 20 is preferably provided on the top edge (a part of the first solder bump 10 opposite to the interposer 30) of each of the first solder bumps 10. With this arrangement, as the metal bumps 20 first make contact with the mounting portion when mounting the semiconductor device 100 to the mounting portion (not shown), the solder can be efficiently conformed via the metal bumps 20.

The semiconductor device 100 of the first embodiment can be manufactured, on the surfaces of the first solder bumps 10 of the semiconductor device 90 (see FIG. 1) of related art, by forming stud bumps (the metal bumps 20) using a known wire bonding tool and a thin metallic wire. As just described, as an existing semiconductor device and a manufacturing device for the same can be used, the semiconductor device 100 can be manufactured at low cost.

In the first embodiment, although the example of the semiconductor device 100 with two pieces of the semiconductor chips 32 stacked on the interposer 30 is described, the number of semiconductor chips to be mounted on the interposer 30 may be one, or three or more. Further, as the interposer 30, the adhesive 34, the substrate electrodes 36, the chip electrode 37, the wire 38, the molding resin 40, the solder resist 42, and the external electrodes 44 are not essential structural components, a configuration without using a part of them as components may be adopted.

Second Embodiment

Figure 4:
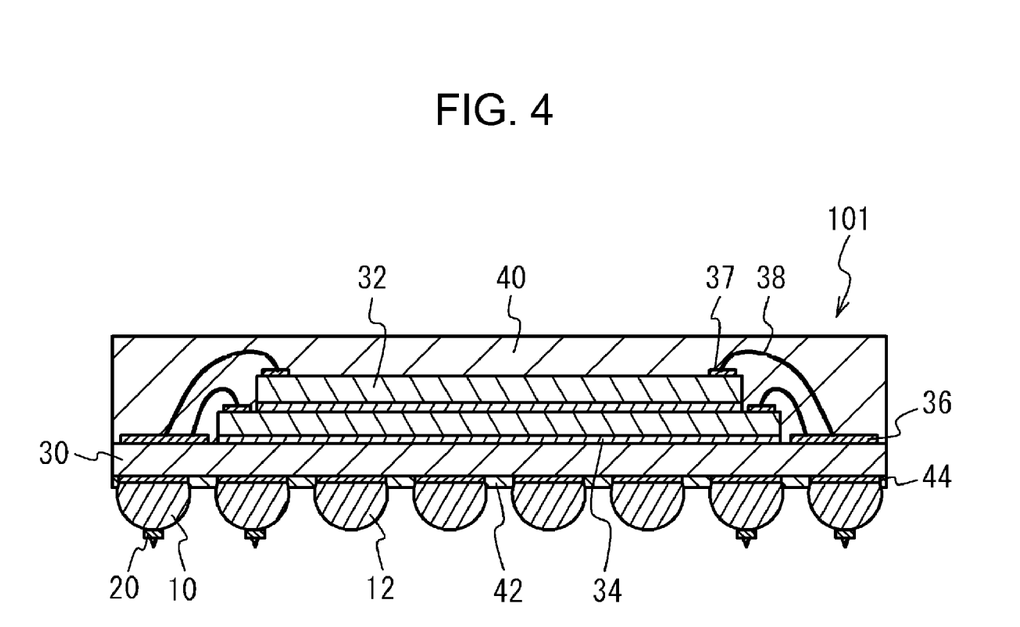
FIG. 4 shows a cross sectional view showing a configuration of a semiconductor device of a second embodiment of the present invention.

A second embodiment of the present invention is an example of a semiconductor device that has solder bumps provided with a metal bump and solder bumps provided with no metal bump. FIG. 4 is a cross sectional view showing a configuration of a semiconductor device 101 of the second embodiment. The semiconductor device 101 has, out of solder bumps provided on the bottom surface of the interposer 30, the first solder bumps 10 each provided with the metal bump 20 on its surface and second solder bumps 12 each provided with no metal bump 20 on its surface. Other configurations are the same as those of the first embodiment.

The first solder bump 10 is higher than the second solder bump 12, by the height of the metal bump 20. The metal bumps 20 are preferably provided corresponding to irregularities of the mounting portion on which the semiconductor device 101 is mounted. Hereafter, this will be described.

Figure 5A:
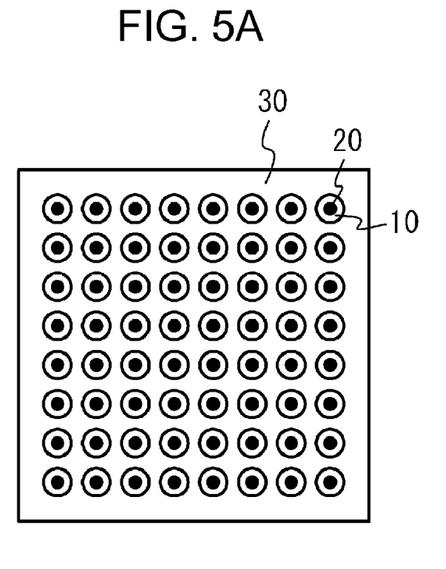
FIG. 5 illustrates bottom views showing the configurations of the semiconductor devices of the first embodiment and the second embodiment.

FIGS. 5A to 5D are bottom views of the semiconductor devices of the first embodiment and the second embodiment. In FIG. 5A, all solder bumps are provided with the metal bumps 20 and the configuration is identical to that of the semiconductor device 100 of the first embodiment. More specifically, all of the solder bumps are the first solder bumps 10 provided with the metal bumps 20 on their surfaces, and this configuration is suitable for stably mounting the semiconductor device 100 when the mounting portion is flat.

Figure 5B:
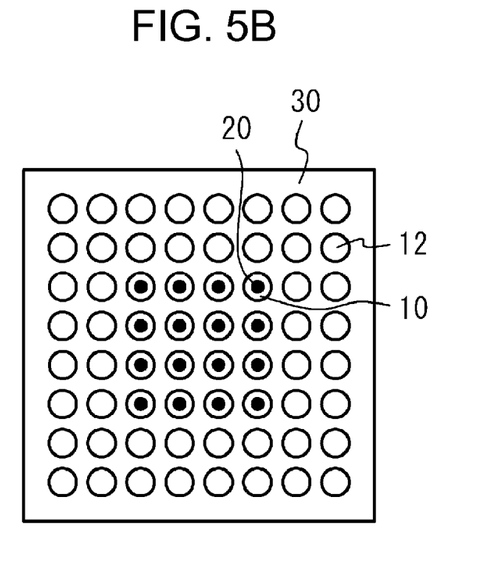

In FIG. 5B, a plurality of first solder bumps 10 are provided in a central part of the interposer 30, and the second solder bumps 12 are provided in a peripheral part of the interposer 30 so as to surround the first solder bumps 10. As a result, when the central part of the mounting portion is lower than the peripheral part, the semiconductor device 101 can be stably mounted.

Figure 5C:
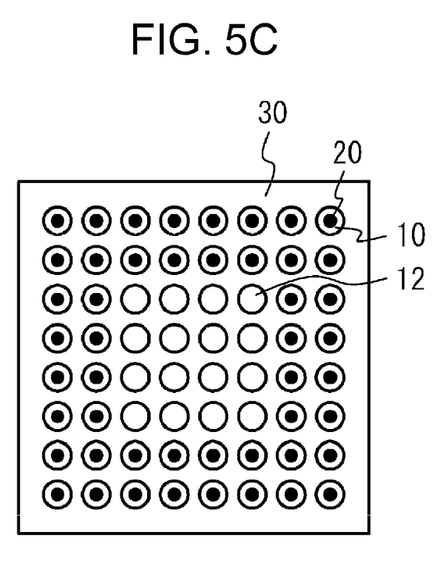

In FIG. 5C, a plurality of second solder bumps 12 are provided in the central part of the interposer 30, and the first solder bumps 10 are provided in the peripheral part of the interposer 30 so as to surround the second solder bumps 12 in a configuration in contrast with that shown in FIG. 5B. Therefore, when the central part of the mounting portion is higher than the peripheral part, the semiconductor device 101 can be stably mounted.

Figure 5D:
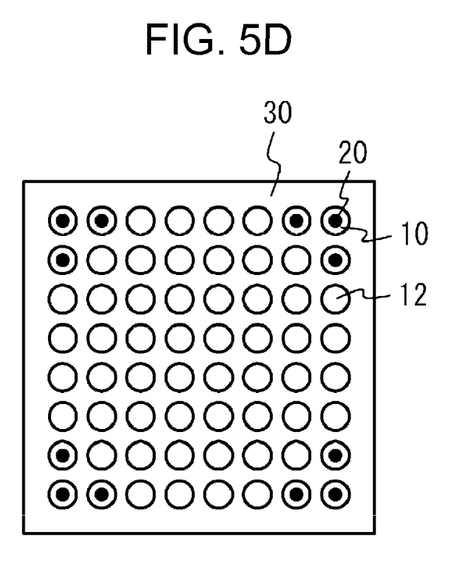

In FIG. 5D, the plurality of first solder bumps 10 are provided at four corners of the rectangular interposer 30, and the second solder bumps 12 are provided on other parts of the interposer 30. Therefore, when the four corners of the mounting portion are lower than the other parts, the semiconductor device 101 can be stably mounted.

The semiconductor device 101 of the second embodiment has the first solder bumps 10 provided with the metal bumps 20 on their surfaces, and the second solder bumps 12 provided with no metal bumps 20 on their surfaces. Furthermore, whether or not to provide the metal bumps 20 is determined corresponding to the irregularities of the mounting portion on which the semiconductor device 101 is to be mounted. Therefore, even when there are some irregularities on the mounting portion, the solder bumps can be stably soldered to the mounting portion. As a result, the connection reliability of the solder bumps can be further improved. Furthermore, the semiconductor device 101 can be easily mounted so as to be horizontal with the mounting portion.

Third Embodiment

Figure 6:
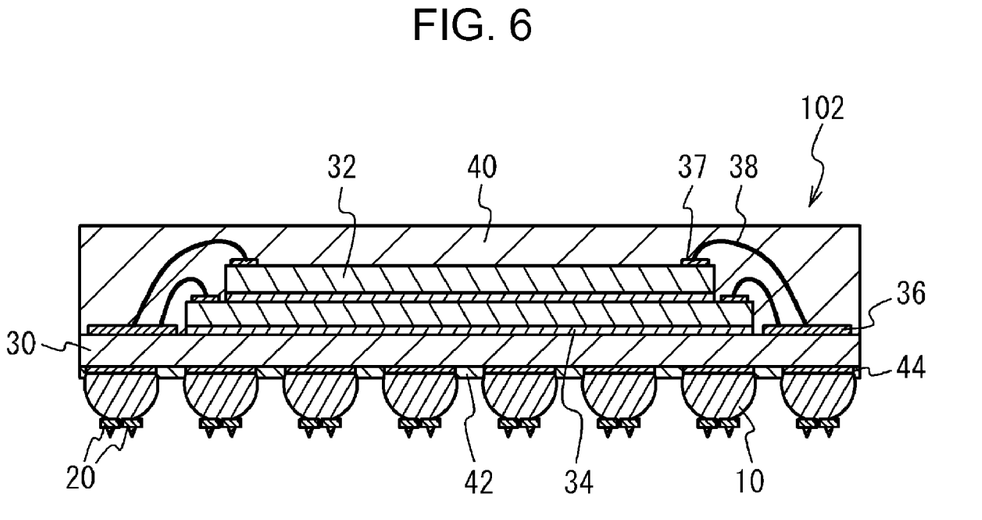
FIG. 6 shows a cross sectional view showing a configuration of a semiconductor device of a third embodiment of the present invention.

A third embodiment of the present invention is an example in which a plurality of metal bumps are provided to a single solder bump. FIG. 6 is a cross sectional view showing a configuration of a semiconductor device 102 of the third embodiment. On the first solder bumps 10 provided on the bottom surface of the interposer 30, a plurality of metal bumps 20 (two pieces each in FIG. 6) are provided. Other configurations are the same as those of the first embodiment.

The semiconductor device 102 of the third embodiment has the first solder bump 10 each provided with a plurality of metal bumps 20. With this configuration, when, for example, mounting the semiconductor device 102 to the mounting portion, the area where the metal bumps make contact with the mounting portion becomes large. Thus, the first solder bumps 10 can be further stably soldered to the mounting portion.

Figure 7:
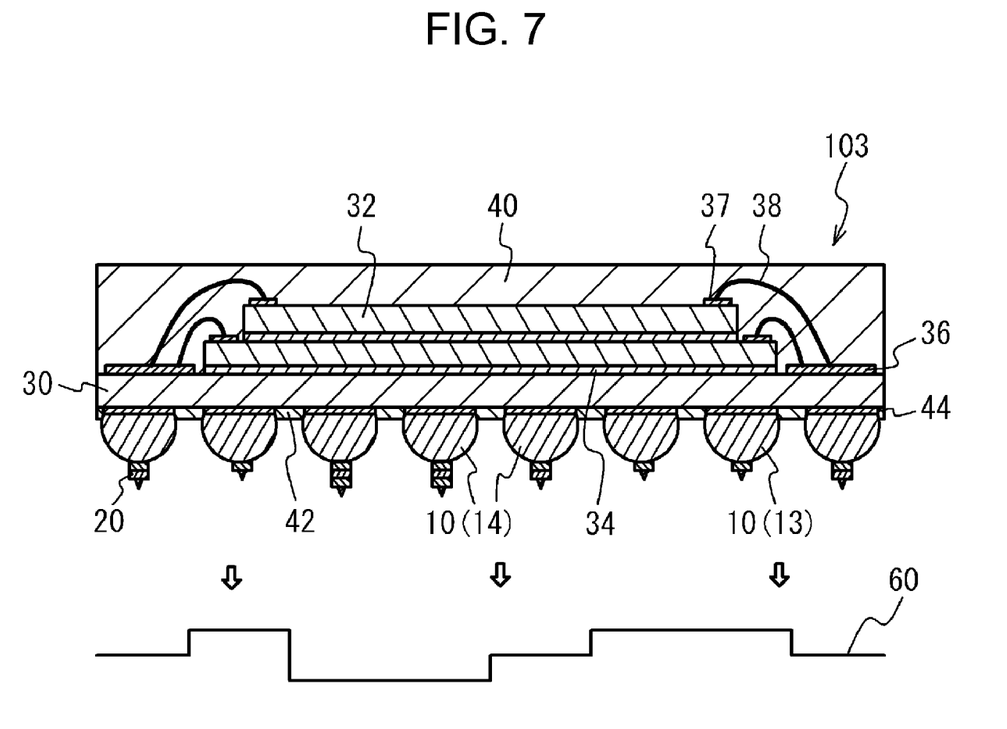
FIG. 7 shows a cross sectional view showing a configuration of another semiconductor device of the third embodiment.

In FIG. 6, while the plurality of metal bumps 20 are arranged in series in the horizontal direction, the plurality of metal bumps 20 may be stacked in the vertical direction. FIG. 7 is a cross sectional view showing a configuration of another semiconductor device 103 of the third embodiment. On the first solder bumps 10 provided on the bottom surface of the interposer 30, the plurality of metal bumps 20 are stacked. Other configurations are the same as those of the first embodiment.

Another semiconductor device 103 of the third embodiment has the first solder bumps 10 provided with the plurality of metal bumps 20 stacked. With this configuration, the total height of the metal bumps 20 can be made higher. Therefore, when mounting the semiconductor device 103 to the mounting portion, the metal bumps 20 more easily make contact with the mounting portion, and the connection reliability of the first solder bump 10 can be further improved.

As shown in FIG. 7, a configuration may be adopted in which a single piece of the metal bump 20 is provided on third solder bumps 13 which are a part of the first solder bumps 10 and two or three pieces of the metal bumps 20 are provided on fourth solder bumps 14 which are the other part of the first solder bumps 10. In this case, it is preferable that the number of the metal bumps 20 corresponds to the irregularities of the mounting portion 60 on which the semiconductor device 103 is to be mounted. More specifically, it is preferable that, on the surface of each third solder bump 13 which is to be bonded to a higher part (protruding portion) of the mounting portion 60, a less number (for example, a single piece) of metal bumps are stacked and, on the surface of each fourth metal bump 14 which is to be bonded to a lower part (recessed portion) of the mounting portion 60, a more number (for example, two to three pieces) of metal bumps are stacked. For example, in the same manner as the first embodiment, when forming the metal bumps 20 using a thin metallic wire having a diameter of 25 μm, the total height of the metal bumps becomes approximately 50 μm with a single piece of metal bump, approximately 100 μm with two pieces of metal bumps, and approximately 150 μm with three pieces of metal bumps. In this manner, by making the number of metal bumps 20 stacked on the surfaces of the first solder bumps 10 different, the total height of the metal bumps 20 can be adjusted corresponding to the irregularities of the mounting portion 60, and the connection reliability of the first solder bumps 10 can be further improved.

With reference to FIG. 7, while the number of metal bumps provided on the surface of each first solder bump 10 is one to three, any other number of metal bumps may be stacked. However, in the semiconductor device 103, the number of the metal bumps 20 stacked on each of the third solder bumps 13 which are a part of the first solder bumps 10, and the number of the metal bumps 20 stacked on each of the fourth solder bumps 14 which are the other part of the first solder bumps 10 must be different.

As described above, on the surfaces of the first solder bumps 10, the metal bumps of different heights (the total height of the metal bumps, not the height of an individual metal bump) can be formed. Furthermore, by forming the total height of the metal bumps corresponding to the irregularities of the mounting portion, the connection reliability of the first solder bumps 10 can be further improved. The semiconductor device 103 shown in FIG. 7 is just an example of stacking a plurality of the metal bumps 20 having the same size to form the metal bumps having different total heights. The method for forming metal bumps having different heights is not limited to this.

Fourth Embodiment

Figure 8A:
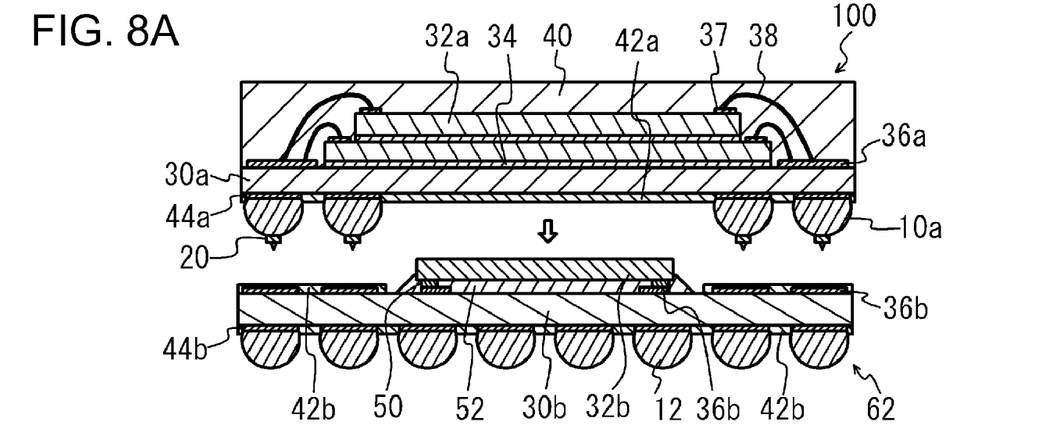
FIG. 8A shows a first cross-sectional view showing a manufacturing method for a semiconductor device for a fourth embodiment of the present invention.
Figure 8B:
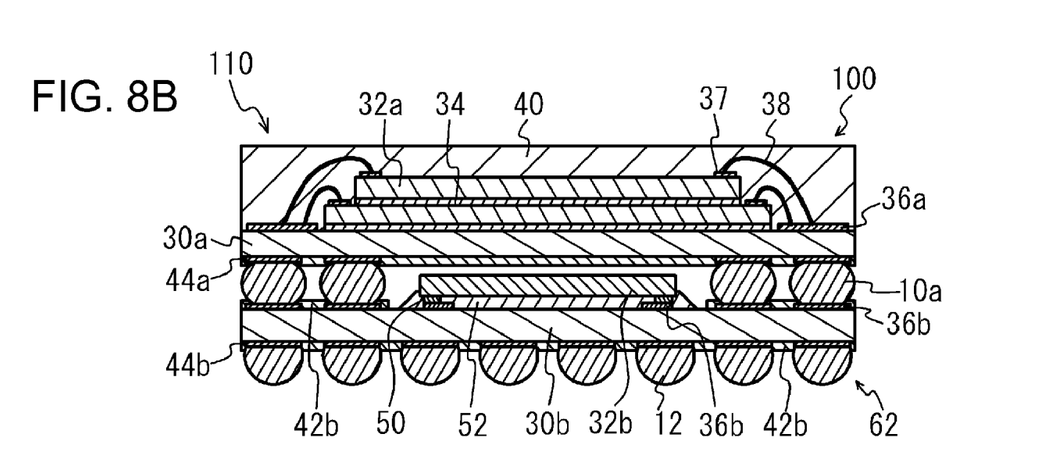
FIG. 8B shows a second cross-sectional view showing a manufacturing method for a semiconductor device for the fourth embodiment of the present invention.

A fourth embodiment of the present invention is an example of a so-called package-on-package semiconductor device in which the semiconductor device 100 of the first embodiment is mounted onto another semiconductor device. FIGS. 8A and 8B are cross sectional views showing a method for manufacturing a semiconductor device 110 of the fourth embodiment.

With reference to FIG. 8A, the semiconductor device 100 of the first embodiment is mounted on a top surface of a semiconductor device 62 which is the mounting portion. In the semiconductor device 62, a semiconductor chip 32b is mounted on an interposer 30b by flip-chip bonding. The semiconductor chip 32b and substrate electrodes 36b provided on a top surface of the interposer 30b are electrically coupled via metal bumps 50 and, in a space between the semiconductor chip 32b and the interposer 30b, the underfill material 52 is filled.

The semiconductor device 100 is, by soldering first solder bumps 10a to the substrate electrodes 36b, secured and electrically coupled to the semiconductor device 62 which is the mounting portion. The first solder bumps 10a once melt by heating and spread out to the surfaces of the substrate electrodes 36b, and solidify again by cooling to bond. In this case, along with the melting of the first solder bumps 10a, each metal bump 20 etches the corresponding first solder bump 10a and serves as a core.

FIG. 8B is a cross sectional view of the semiconductor device 110 after soldering. The semiconductor device 100 is mounted on the top surface of the semiconductor device 62, and an external electrode 44a and the substrate electrode 36b are electrically coupled via the first solder bumps 10a. The first solder bumps 10a are etched by the metal bumps 20.

According to the manufacturing method for the semiconductor device of the forth embodiment, the semiconductor device 100 is mounted on the semiconductor device 62 which is the mounting portion, by bonding the first solder bumps 10a on the surface of which the metal bumps 20 are formed. With this method, when the first solder bumps 10a melt, each metal bump 20 etches the corresponding first solder bump 10a and serves as a core. Thus, the connection reliability of the first solder bumps 10a is improved. Consequently, as the semiconductor device 100 can be stably mounted onto the semiconductor device 62, the stability of the package-on-package semiconductor device in particular can be improved.

With reference to FIGS. 8A and 8B, while the example of mounting the semiconductor device 100 of the first embodiment to the mounting portion is described, the semiconductor devices 101 to 103 of the second embodiment and the third embodiment may be mounted to the mounting portion in place of the semiconductor device 100. Furthermore, a plurality of these semiconductor devices may be mounted in combination.

Fifth Embodiment

A fifth embodiment of the present invention is an example of using a flux containing metal grain in place of metal bumps. FIGS. 9A to 9D are cross sectional views showing a manufacturing method for a semiconductor device 111 of the fifth embodiment.

Figure 9A:
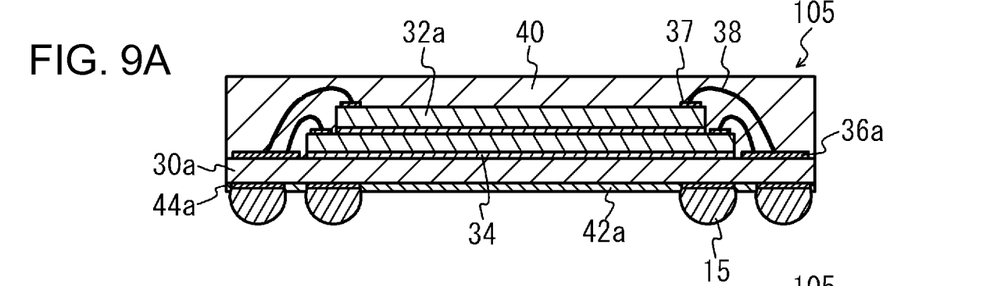
FIG. 9A shows a first cross-sectional view showing a manufacturing method for a semiconductor device for a fifth embodiment of the present invention.

With reference to FIG. 9A, a semiconductor device 105 is a semiconductor device in which two semiconductor chips 32a are stacked on the top surface of the interposer 30a and sealed by the molding resin 40, and solder bumps 15 are provided on the bottom surface of the interposer 30a. Except that no metal bumps 20 are provided on top edges of the solder bumps 15, the configurations are the same as those of the semiconductor device 100 of the first embodiment, and therefore the detailed description is omitted.

Figure 9B:
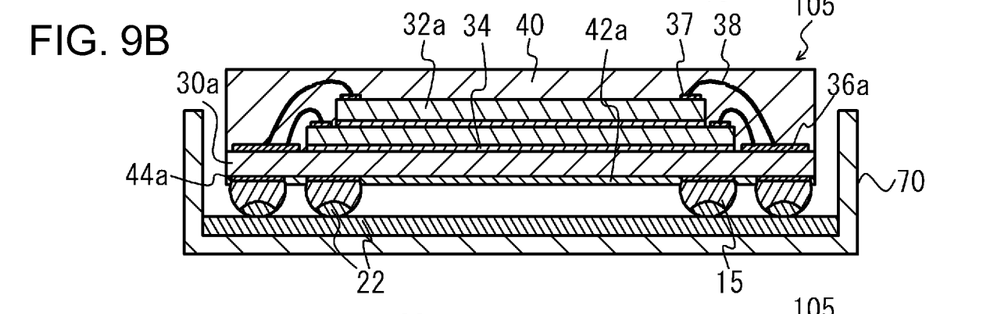
FIG. 9B shows a second cross-sectional view showing a manufacturing method for a semiconductor device for a fifth embodiment of the present invention.

With reference to FIG. 9B, with the surface on which the solder bump 15 are provided face down, the semiconductor device 105 is placed in a container 70 in which a flux 22 is contained so that the surfaces of the solder bumps 15 are coated with the flux 22. The flux 22 is coated such that it covers at least the top edges (an opposite side to the external electrode 44a) of the solder bumps 15.

The flux 22 is to heighten the wettability and to improve the bonding performance of the solder bumps 15 and is made of, for example, a material of rosin (pine resin) and the like. The flux 22 further includes a metal having a higher melting point than that of the solder bumps 15. As for the metal included in the flux 22, the use of a material having high wettability with solder (for example, gold) is preferable.

Figure 9C:
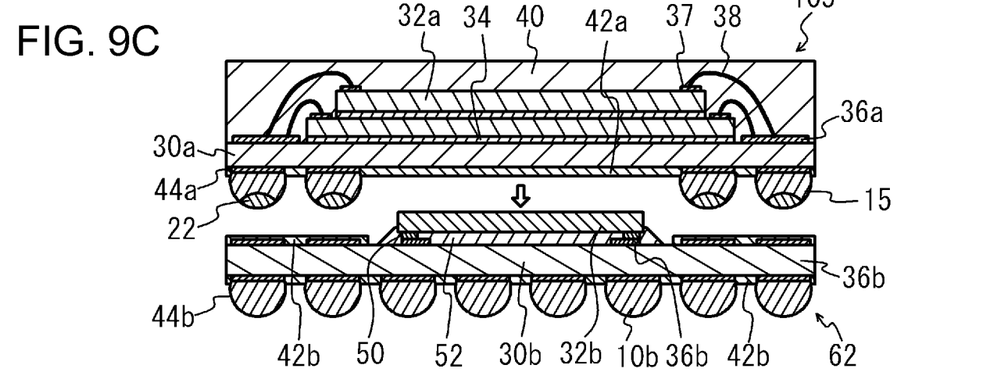
FIG. 9C shows a third cross-sectional view showing a manufacturing method for a semiconductor device for a fifth embodiment of the present invention.

With reference to FIG. 9C, the semiconductor device 105 in which the top edges of solder bumps 15 are coated with the flux 22 is mounted to the semiconductor device 62 which is the mounting portion. The semiconductor device 62 is identical to that used in the fourth embodiment. The solder bumps 15 are bonded to the substrate electrodes 36b provided on the top surface of the semiconductor device 62. In this case, along with the melting of the solder bumps 15, the flux 22 etches the solder bumps 15.

Figure 9D:
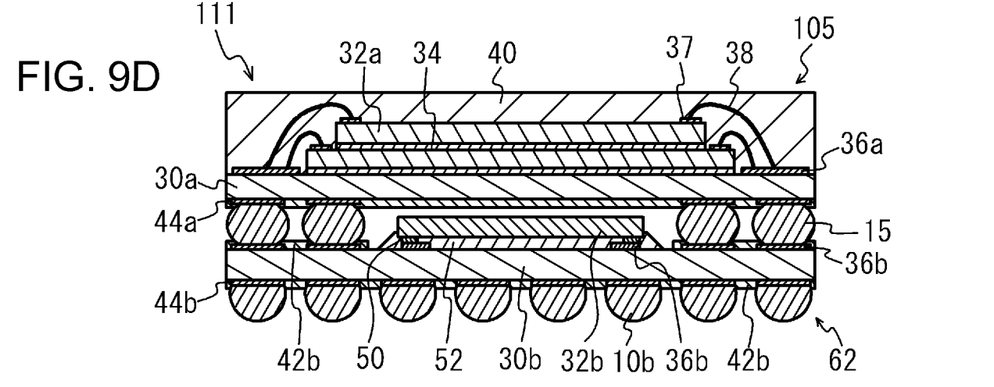
FIG. 9D shows a fourth cross-sectional view showing a manufacturing method for a semiconductor device for a fifth embodiment of the present invention.

FIG. 9D is a cross sectional view of the semiconductor device 111 after soldering. The semiconductor device 105 is mounted on the top surface of the semiconductor device 62, and the external electrode 44a and the substrate electrodes 36b are electrically coupled via the solder bumps 15. The solder bumps 15 are etched by the flux 22.

According to the manufacturing method for the semiconductor device of the fifth embodiment, the semiconductor device 105 is mounted on the semiconductor device 62, which is the mounting portion, by bonding the solder bumps 15 having the surfaces coated with the flux 22. With this method, as the flux is coated on the surfaces of the solder bumps 15, the bonding performance of the solder bumps 15 is improved. Further, as the flux 22 includes the metal having a higher melting point than that of the solder bumps 15, the bonding performance of the solder bumps 15 can be further improved. As a result, the semiconductor device 100 can be stably mounted to the semiconductor device 62. Thus, the stability of the package-on-package semiconductor device in particular can be improved.

In the fourth embodiment and the fifth embodiment, while the example of the semiconductor device 62 serving as the mounting portion is described. However, another member may be used as the mounting portion as long as it can directly or indirectly mount the semiconductor chip 32 via the solder bumps 15. For example, as the mounting portion, another interposer or an interconnection substrate of an electronic device may be used.

Now, several aspects of the present invention are summarized below.

A semiconductor device according to one aspect of the present invention includes: a semiconductor chip; a plurality of solder bumps that electrically couple the semiconductor chip to the outside; and a metal bump being provided on a surface of each first solder bump which is at least a part of the plurality of solder bumps and being made of a metal having a melting point higher than that of the first solder bump.

In the above-described arrangement, the plurality of solder bumps may include a second solder bump that is provided with no metal bump on a surface thereof. This arrangement makes it possible to stably bond the solder bumps on a mounting portion where the semiconductor device is mounted even if the mounting portion has surface irregularities.

In the above-described arrangement, the metal bump may be provided in a plurality on the surface of at least a part of the first solder bumps. This arrangement increases the area of the metal bumps that come into contact with the mounting portion, thereby further enhancing the connection reliability of the solder bumps.

In the above-described arrangement, a plurality of the metal bumps may be stacked on the surface of at least a part of the first solder bumps. This arrangement increases the total height of the metal bumps, thereby further enhancing the connection reliability of the solder bumps.

In the above-described arrangement, the metal bumps may be stacked on a surface of a third solder bump which is a part of the first solder bumps, and the metal bump, the number of which is different from the number of the metal bumps provided on the surface of the third solder bump, is stacked on a surface of a fourth solder bump which is another part of the first solder bumps. This arrangement makes it possible to adjust the total height of the metal bumps depending on the surface irregularities of the mounting portion, thereby bonding the solder bumps on the mounting portion in a more stable manner.

In the above-described arrangement, the metal bump may be made of a gold stud bump. This arrangement makes it possible to easily form the metal bumps on the surface of the solder bumps.

In the above-described arrangement, the metal bump may be made of gold. This arrangement further enhances the connection reliability of the solder bumps, because gold has high wettability with solder.

A method for manufacturing a semiconductor device according to another aspect of the present invention includes the steps of: forming a metal bump on a surface of each first solder bump which is at least a part of a plurality of solder bumps that electrically couple a semiconductor chip to an external electrode, the metal bump being made of a metal having a melting point higher than that of the first solder bump; and bonding the first solder bump on a mounting portion where the semiconductor chip is mounted. This method makes it possible to increase the wettability of the solder bumps, because each metal bump serves as a core when the corresponding solder bump melts. As a result, it is possible to bond the solder bumps to the mounting portion in a stable manner.

In the above-described method, the step of forming the metal bump on the surface of each first solder bump may include the step of forming a plurality of the metal bumps on the surface of at least a part of the first solder bumps. This method increases the area of the metal bumps that come into contact with the mounting portion, thereby bonding the solder bumps to the mounting portion in a more stable manner.

In the above-described method, the step of forming the metal bump on the surface of each first solder bump may include the step of stacking a plurality of the metal bumps on the surface of at least a part of the first solder bumps. This method increases the total height of the metal bumps, thereby bonding the solder bumps to the mounting portion in a more stable manner.

In the above-described method, the step of forming the metal bump on the surface of each first solder bump may include the step of: stacking the metal bumps on a surface of a third solder bump which is a part of the first solder bumps; and stacking the metal bump, the number of which is different from the number of the metal bumps formed on the surface of the third solder bump, on a surface of a fourth solder bump which is another part of the first solder bumps.

In the above-described method, the step of forming the metal bumps on the surfaces of the third solder bump and the fourth solder bump may include the step of forming, on the surfaces of the third solder bump and the fourth solder bump, the metal bumps of the number corresponding to surface irregularities of the mounting portion on which the solder bumps are mounted. This method makes it possible to adjust the total height of the metal bumps depending on the surface irregularities of the mounting portion, thereby bonding the solder bumps on the mounting portion in a more stable manner.

In the above-described method, the step of forming the metal bump on the surface of each first solder bump may include the step of forming the metal bumps having different sizes on the surfaces of the first solder bumps.

In the above-described method, the step of forming the metal bumps having different sizes on the surfaces of the first solder bumps may include the step of forming, on the surfaces of the first solder bumps, metal bumps having sizes corresponding to surface irregularities of the mounting portion on which the solder bumps are mounted. This method makes it possible to adjust the total height of the metal bumps depending on the surface irregularities of the mounting portion, thereby bonding the solder bumps on the mounting portion in a more stable manner.

A method for manufacturing a semiconductor device according to a still another aspect of the present invention includes the steps of: applying, to a surface of a solder bump that electrically couples a semiconductor chip to an external electrode, a flux containing a metal with a higher melting point than that of the solder bump; and bonding the solder bump having the surface to which the flux is applied on a mounting portion where the semiconductor chip is mounted. This method makes it possible to enhance the wettability of the solder bump because the flux contains a metal having a melting point higher than that of the solder bump, thereby bonding the solder bump to the mounting portion in a stable manner.

In the above-described method, the mounting portion may be an interposer on which the semiconductor chip is mounted. This method makes it possible to provide a package-on-package semiconductor device in a stable manner.

According to some aspects of the present invention, the wettability of the solder bumps is improved because each metal bump serves as a core when the corresponding solder bump melts. Thus, the connection reliability of the solder bumps can be improved.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A semiconductor device comprising:
    a semiconductor chip;
    a plurality of solder bumps that electrically couple the semiconductor chip to an external circuit; and
    a metal bump disposed on a surface of a first solder bump of the plurality of solder bumps wherein a width of the metal bump is less than the diameter of the first solder bump and comprising a metal having a melting point higher than that of the first solder bump wherein the first solder bump is positioned between the semiconductor chip and the metal bump.

2. The semiconductor device according to claim 1, wherein the plurality of solder bumps include a second solder bump that has no metal bump on a surface thereof.

3. The semiconductor device according to claim 1, wherein the metal bump is stacked on the surface of at least a part of the first solder bump.

4. The semiconductor device according to claim 1, wherein the metal bump is stacked on a surface of a third solder bump.

5. The semiconductor device according to claim 1, wherein the metal bump comprises a gold stud bump.

6. A method for manufacturing a semiconductor device, comprising the steps of:
    forming a metal bump on a surface of a first solder bump of a plurality of solder bumps that electrically couple a semiconductor chip to an external electrode wherein the metal bump has a width that is less than the diameter of the first solder bump, the metal bump being made of a metal having a melting point higher than that of the first solder bump; and
    bonding the first solder bump on a mounting portion wherein the first solder bump is positioned between the semiconductor chip and the metal bump.

7. The method for manufacturing a semiconductor device according to claim 6, wherein the step of forming the metal bump on the surface of each first solder bump includes the step of: stacking a metal bump on a surface of a third solder bump on a surface of a fourth solder bump so that metal bumps, the number of which corresponds to surface irregularities of the mounting portion on which the solder bumps are mounted, are formed on the surfaces of the third solder bump and the fourth solder bump.

8. The method for manufacturing a semiconductor device according to claim 6, wherein the step of forming a metal bump on the surface of each first solder bump includes forming, on the surface of each first solder bump, bumps having different heights corresponding to surface irregularities of the mounting portion on which the solder bumps are mounted.

9. A method for manufacturing a semiconductor device, the method comprising the steps of:
    applying, to a surface of a solder bump that electrically couples a semiconductor chip to an external electrode, a flux containing a metal with a higher melting point than that of the solder bump wherein the width of the flux is less than the diameter of the solder bump; and
    bonding the solder bump having the surface to which the flux is applied on a mounting portion wherein the solder bump is positioned between the semiconductor chip and the metal.

10. The method for manufacturing a semiconductor device according to any one of claims 6 to 9, wherein the mounting portion is an interposer on which the semiconductor chip is mounted.

* * * * *